United States Patent [19]

Tsuda

[11] Patent Number: 6,025,112
[45] Date of Patent: Feb. 15, 2000

[54] PHOTOCURABLE COMPOSITION AND PHOTOSENSITIVE CAPSULES

[75] Inventor: Masashi Tsuda, Nagoya, Japan

[73] Assignee: Brother Kogyo Kabushiki Kaisha, Nagoya, Japan

[21] Appl. No.: 08/796,389

[22] Filed: Feb. 4, 1997

[30] Foreign Application Priority Data

Feb. 9, 1996 [JP] Japan .................................. 8-024084

[51] Int. Cl.$^7$ .......................... G03C 1/725; G03C 1/72
[52] U.S. Cl. ................. 430/281.1; 430/138; 430/914; 430/916; 430/919; 430/926; 522/10; 522/66
[58] Field of Search ..................... 428/402.2, 402.21; 430/138, 281.1, 914, 916, 919, 926; 522/10, 66

[56] References Cited

U.S. PATENT DOCUMENTS

| | | | |
|---|---|---|---|
| Re. 28,789 | 4/1976 | Chang ........................ | 96/86 P |
| 2,800,457 | 7/1957 | Green et al. ................. | 252/316 |
| 2,800,458 | 7/1957 | Green ......................... | 252/316 |
| 3,418,118 | 12/1968 | Thommes et al. .............. | 96/11 |
| 3,479,185 | 11/1969 | Chambers ..................... | 96/84 |
| 3,652,275 | 3/1972 | Baum et al. .................. | 96/48 |
| 4,089,802 | 5/1978 | Foris et al. .................. | 252/316 |
| 4,162,162 | 7/1979 | Dueber ........................ | 96/115 P |
| 4,940,645 | 7/1990 | Davis et al. ................. | 430/438 |
| 4,985,470 | 1/1991 | Nagasaka et al. .............. | 522/26 |
| 4,997,717 | 3/1991 | Rembold et al. ............... | 478/413 |
| 5,047,442 | 9/1991 | Sasaki et al. ................ | 522/27 |
| 5,100,756 | 3/1992 | Kobayashi .................... | 430/138 |
| 5,466,556 | 11/1995 | Inaishi ....................... | 430/138 |
| 5,514,521 | 5/1996 | Kobayashi .................... | 430/281.1 |
| 5,639,802 | 6/1997 | Neckers et al. ............... | 522/25 |

FOREIGN PATENT DOCUMENTS

| | | |
|---|---|---|
| 36-9168 | 6/1936 | Japan . |
| 38-19574 | 9/1938 | Japan . |
| 42-446 | 1/1942 | Japan . |
| 42-771 | 1/1942 | Japan . |
| 44-20189 | 8/1969 | Japan . |
| 45-37377 | 11/1970 | Japan . |
| 47-2528 | 2/1972 | Japan . |
| 48-84183 | 11/1973 | Japan . |
| 51-9079 | 1/1976 | Japan . |
| 52-134692 | 11/1977 | Japan . |
| 54-151024 | 11/1979 | Japan . |
| 54-155292 | 12/1979 | Japan . |
| 57-21401 | 2/1982 | Japan . |
| 58-19315 | 2/1983 | Japan . |
| 58-29803 | 2/1983 | Japan . |
| 58-40302 | 3/1983 | Japan . |
| 59-56403 | 3/1984 | Japan . |
| 60-32801 | 2/1985 | Japan . |
| 61-258802 | 11/1986 | Japan . |
| 61-258803 | 11/1986 | Japan . |
| 3-77961 | 4/1991 | Japan . |
| 3-80258 | 4/1991 | Japan . |
| 4-102856 | 4/1992 | Japan . |
| 5-66559 | 3/1993 | Japan . |
| 5-68871 | 3/1993 | Japan . |
| 5-297552 | 11/1993 | Japan . |
| 5-311093 | 11/1993 | Japan . |
| 952807 | 3/1964 | United Kingdom . |
| 965074 | 7/1964 | United Kingdom . |

OTHER PUBLICATIONS

Wang, P. et al., "Cyclopentadienyl (iron)arene–bis(p–N, N–dimethylaminobenzylidene)–cyclopentaone photoinitiated polymerization of methyl methacrylate and styrene", J.Mol.Sci.Pure Appl.Chem., A32(12), pp. 1973–1983, 1995.

Fouassier, J.P. et al., "Visible light induced polymerization reactions: The seven–role of the electron transfer process in the dye/iron arene compoex/amine system", J.Appl.Pol.Sci., 62, pp. 1877–1885, 1996.

*Primary Examiner*—Janet Baxter
*Assistant Examiner*—Rosemary Ashton
*Attorney, Agent, or Firm*—Oliff & Berridge, PLC

[57] ABSTRACT

A photocurable composition comprises an unsaturated group-containing compound as a base material, a metal arene compound as a photopolymerization initiator and an aniline compound as a photosensitizer. As the photosensitizer aniline compound, any one or both of 2,6-diisopropyl-N,N-dimethylaniline and 2,4,6,N,N-pentamethylaniline is/are used.

40 Claims, No Drawings

PHOTOCURABLE COMPOSITION AND PHOTOSENSITIVE CAPSULES

BACKGROUND OF THE INVENTION

1. Field of the Invention

This invention relates to a photocurable composition and this is photosensitive capsules, used in image forming apparatus or printers.

2. Description of the Related Art

Photosensitive capsules which internally hold image forming materials such as dye precursors, dyes, pigments or the like and respond to light to cause a change in mechanical strength are known in the art as disclosed in Japanese Patent Application Laid-open No. 5-066559. Image forming apparatus which employ toners comprised of such photosensitive capsules are also disclosed in Japanese Patent Applications Laid-open No.5-068871, No.5-066559 and No. 5-297552, in which the toners are exposed to light and thereafter images are formed on image-receiving paper by a developing process that applies, e.g., a pressure to break only toner capsules having lower strength.

In the photosensitive capsules used in such image forming apparatus, photocurable compositions containing a dye material or the like are used. As photocurable compositions containing no dye material, various ones are known for a long time. For example, a photoradically polymerizable composition is formed of a radically polymerizable unsaturated group-containing compound as a base material, a photopolymerization initiator, a sensitizer and so forth added thereto.

In this instance, the photopolymerization initiator includes benzil, Michler's ketone, diethyl thioxanthone, benzophenone and acetophenone, which are each used alone.

As composite type photopolymerization initiators, they are known to include as follows:

(1) a composite type initiator comprised of a dye and an aliphatic amine (Japanese Patent Publication No.44-20189);

(2) a composite type initiator comprised of a hexaarylbiimidazole, a radical generator and a dye (Japanese Patent Publication No. 45-37377);

(3) a composite type initiator comprised of a hexaarylbiimidazole and a p-dialkylaminobenzilidene ketone (Japanese Patent Application Laid-open No. 47-2528);

(4) a composite type initiator comprised of a cyclic cis-α-dicarbonyl compound and a dye (Japanese Patent Application Laid-open No. 48-84183);

(5) a composite type initiator comprised of a carbonyl compound and a tertiary amine (Japanese Patent Application Laid-open No. 52-134692);

(6) a composite type initiator comprised of a substituted triazine and a merocyanine dye (Japanese Patent Application Laid-open No. 54-151024);

(7) a composite type initiator comprised of biimidazole and indanone (Japanese Patent Application Laid-open No. 54-155292);

(8) a composite type initiator comprised of a hexaarylbiimidazole and a p-dialkylaminostilbene derivative (Japanese Patent Application Laid-open No. 57-21401);

(9) a composite type initiator comprised of a hexaarylbiimidazole and a p-alkylaminocinnamylidene derivative (Japanese Patent Application Laid-open No. 58-19315);

(10) a composite type initiator comprised of a triazine derivative and a cyanine dye (Japanese Patent Application Laid-open No.58-29803);

(11) a composite type initiator comprised of a triazine derivative and a thiapyrylium salt (Japanese Patent Application Laid-open No. 58-40302);

(12) a composite type initiator comprised of a hexaarylbiimidazole and an n-dialkylaminostilbene derivative, or of a p-dialkylaminophenylbutadienyl derivative and a thiol compound (Japanese Patent Application Laid-open No. 59-56403);

(13) a composite type initiator comprised of a ketone substituted derivative and an organic peroxide (Japanese Patent Application Laid-open No. 60-32801);

(14) a composite type initiator comprised of an α-diketone and a mercaptocarboxylic acid (Japanese Patent Application Laid-open No. 61-258802); and

(15) a composite type initiator comprised of an α-diketone and a polysulfide (Japanese Patent Application Laid-open No. 61-258803).

However, photocurable compositions making use of any of these photopolymerization initiators of a sole type or composite type have a problem that a photocuring sensitivity is poor and a curing velocity is low and hence time longer than intended is required in order to record images.

SUMMARY OF THE INVENTION

The present invention was made in order to solve the above problem. Accordingly, an object of the present invention is to provide a photocurable composition and photosensitive capsules, having a high sensitivity.

To achieve this object the present invention provides as a first mode a photocurable composition highly sensitive to near infrared radiation and visible light having a wavelength of 550 nm or less, comprising an unsaturated group-containing compound as a base material, a metal arene compound as a photopolymerization initiator and an aniline compound as a photosensitizer, wherein;

the aniline compound is at least one of 2,6-diisopropyl-N,N-dimethylaniline and 2,4,6,N,N-pentamethylaniline.

The present invention also provides as a second mode a photocurable composition, comprising an unsaturated group-containing compound as a base material, a metal arene compound as a photopolymerization initiator, an aniline compound as a photosensitizer and a dye as a spectral sensitizer for controlling a curing wavelength of the unsaturated group-containing compound, wherein;

said aniline compound is at least one of 2,6-diisopropyl-N,N-dimethylaniline and 2,4,6,N,N-pentamethylaniline, and said dye is at least one of a coumarin dye and a cyanine dye.

The present invention further provides as a third mode a photosensitive capsule internally holding a photocurable composition highly sensitive to near infrared radiation and visible light having a wavelength of 550 nm or less, said composition comprising an unsaturated group-containing compound as a base material, a metal arene compound as a photopolymerization initiator and an aniline compound as a photosensitizer, wherein;

the aniline compound is at least one of 2,6-diisopropyl-N,N-dimethylaniline and 2,4,6,N,N-pentamethylaniline.

This and other objects, features and advantages of the present invention are described in or will become apparent from the following description of the preferred embodiments.

DESCRIPTION OF THE PREFERRED EMBODIMENTS

The present invention will be described below in detail.

The photocurable composition highly sensitive to near infrared radiation and visible light of a wavelength of 550 nm or less, which is the first mode of the present invention, comprises an unsaturated group-containing compound as a polymerizable base material, a metal arene compound as a photopolymerization initiator and an aniline compound as a photosensitizer. In this photocurable composition, there is/are used any one or both of 2,6-diisopropyl-N,N-dimethylaniline and 2,4,6,N,N-pentamethylaniline as the aniline compound. This makes it possible to achieve a remarkable improvement in sensitivity.

The unsaturated group-containing compound may include compounds having an ethylene type unsaturated group, and may also include compounds having an epoxy group.

The compounds having an ethylene type unsaturated group may include acrylic acid and salts thereof, acrylic esters, acrylamides, methacrylic acid and salts thereof, methacrylic esters, methacrylamides, maleic anhydride, maleates, itaconates, styrenes, vinyl ethers, vinyl esters, N-vinyl heterocyclics, allyl ethers, allyl esters, and derivatives of these. In particular, acrylates or methacrylates are preferred.

As examples of the acrylic esters, they may include butyl acrylate, cyclohexyl acrylate, ethylhexyl acrylate, benzyl acrylate, furfuryl acrylate, ethoxyethyl acrylate, nonylphenyloxyethyl acrylate, hexanediol acrylate, 1,3-dioxolane acrylate, hexanediol diacrylate, butanediol diacrylate, neopentyl glycol diacrylate, polyethylene glycol diacrylate, tricyclodecane dimethyrol diacrylate, tripropylene glycol diacrylate, bisphenol-A diacrylate, pentaerythritol triacrylate, dipentaerythritol hexaacrylate, hexaacrylate of caprolactone adduct of dipentaerythritol, trimethyrolpropane triacrylate, triacrylate of propylene oxide adduct of trimethyrolpropane, diacrylate of polyoxyethylated bisphenol-A, polyester acrylate, and polyurethane acrylate.

As examples of the methacrylic esters, they may include butyl methacrylate, cyclohexyl methacrylate, ethylhexyl methacrylate, benzyl methacrylate, furfuryl methacrylate, ethoxyethyl methacrylate, nonylphenyloxyethyl methacrylate, hexanediol methacrylate, 1,3-dioxolane methacrylate, hexanediol dimethacrylate, butanediol dimethacrylate, neopentyl glycol dimethacrylate, polyethylene glycol dimethacrylate, tricyclodecane dimethyrol dimethacrylate, tripropylene glycol dimethacrylate, bisphenol-A dimethacrylate, pentaerythritol trimethacrylate, dipentaerythritol hexamethacrylate, hexamethacrylate of a caprolactone adduct of dipentaerythritol, trimethyrolpropane trimethacrylate, trimethacrylate of a propylene oxide adduct of trimethyrolpropane, dimethacrylate of polyoxyethylated bisphenol-A, polyester methacrylate, and polyurethane methacrylate.

These unsaturated group-containing compounds may each be used alone or in combination of two or more kinds.

The metal arene compound serves as a photopolymerization initiator, and is a compound capable of responding to light to initiate the polymerization of the above unsaturated group-containing compound. As metal arene compounds, arene complexes of iron, nickel, cobalt, chromium or the like may be used. In particular, iron arene complexes are most preferred, as being most readily available, and may specifically include ($\eta^5$-2,4-cyclopentadien-1-yl) [(1,2,3,4,5,6-$\eta$)-(1-methylethyl)benzene]iron(1+) hexafluorophosphate(1–).

The photocurable composition of the present invention may preferably be further incorporated with a dye as a spectral sensitizer for controlling a curing wavelength. This makes it possible to cause a curing reaction at a wavelength different from an absorption wavelength of the photopolymerization initiator. Such a dye may include xanthene dyes, coumarin dyes, merocyanine dyes, thiazine dyes, azine dyes, methine dyes, oxazine dyes, phenylmethane dyes, cyanine dyes, azo dyes, anthraquinone dyes, pyrazoline dyes, stilbene dyes, quinoline dyes and leuco dyes, which are capable of shifting a sensitizing wavelength.

Any of these may be used alone or in combination of two or more kinds.

In instances where coloring is desired, the photocurable composition as described above may be incorporated with a coloring material (herein excluding the dye) such as a pigment, a pigment precursor or the like. In such instances, the pigment may preferably include organic pigments such as monoazo pigments, disazo pigments, azo lake pigments, quinacridone pigments, perylene pigments, anthrapyrimidine pigments, isoindolinone pigments, indanthrene pigments and phthalocyanine pigments, and inorganic pigments such as carbon black, chromium yellow, red iron oxide, titanium oxide, molybdenum red, cadmium red, cobalt blue and chromium green. The dye precursor may preferably include diphenylmethane compounds, triphenylmethane compounds, bisphenylmethane compounds, xanthene compounds, thiazine compounds, fluorane compounds and spiropyrane compounds.

Any of these dyes or coloring materials may be used alone or in combination of two or more kinds.

The photocurable composition of the second mode of the present invention will be explained as below. The photocurable composition of the second mode has been invented based on the inventor's findings that, of many dyes, a dye having higher sensitivity to light of a wavelength around 450 nm is a coumarin dye, and that a dye having the higher sensitivity to light of a wavelength around 550 nm is a cyanine dye.

The photocurable composition of the second mode comprises an unsaturated group-containing compound as a base material, a metal arene compound as a photopolymerization initiator, an aniline compound as a photosensitizer and a dye as a spectral sensitizer for controlling a curing wavelength of the unsaturated group-containing compound. In this composition, not only any one or both of 2,6-diisopropyl-N,N-dimethylaniline and 2,4,6,N,N-pentamethylaniline is/are used as the aniline compound, but also any one or both of a coumarin dye and a cyanine dye is/are used as a spectral sensitizer. This makes it possible to achieve a remarkable improvement in sensitivity.

In this composition of the second mode, as the coumarin dye, there may be preferably used those having high sensitivity to light of a wavelength around 450 nm, and as the cyanine dye, there may be preferably used those having high sensitivity to light of a wavelength around 550 nm.

In this composition of the second mode, the unsaturated group-containing compound and the metal arene compound to be used are as defined in the photocurable composition of the first mode.

The photocurable composition of the second mode may also preferably be further incorporated with another dye other than the coumarin dye and the cyanine dye as a spectral sensitizer for controlling a curing wavelength. The another dye may include xanthene dyes, merocyanine dyes, thiazine dyes, azine dyes, methine dyes, oxazine dyes, phenylmethane dyes, azo dyes, anthraquinone dyes, pyrazoline dyes, stilbene dyes, quinoline dyes and leuco dyes, which are capable of shifting a sensitizing wavelength. Any of these may be used alone or in combination of two or more kinds.

The photocurable composition of the second mode may be incorporated with a coloring material as explained in the photocurable composition of the first mode.

As a compositional ratio in the photocurable composition of the second mode as described above, the metal arene as a photopolymerization initiator may preferably be in an amount of from 0.1 to 20 parts by weight, and the aniline compound as a photosensitizer, from 0.1 to 10parts by weight, and the dye as a spectral sensitizer, from 0.01 to 1 parts by weight, based on 100 parts by weight of the unsaturated group-containing compound. In this instance, the coloring material may preferably be in an amount of from 0.1 to 10 parts by weight. More preferably, the metal arene compound as a photopolymerization initiator may be in an amount of from 1 to 10 parts by weight, the aniline compound as a photosensitizer, from 0.5 to 2 parts by weight, and the dye as a photosensitizer, from 0.05 to 0.2 parts by weight, based on 100 parts by weight of the unsaturated group-containing compound. In this instance, the coloring material may preferably be in an amount of from 0.1 to 0.5 parts by weight.

The photosensitive capsule of the third mode of the present invention, internally holding a photocurable composition will be described below.

The photosensitive capsule of the third mode is comprised of a shell and a liquid component in the shell. As the liquid component, there is used the photocurable composition of the first mode. The photocurable composition of the second mode may also be used.

This photosensitive capsule may have an average particle diameter of from 5 μm to 20 μm, which is considered preferable but without any particular limitations.

The photosensitive capsule constituted in this way can be produced by methods already known in the art in the present industrial field. Such methods are exemplified by the phase separation from an aqueous solution, as disclosed in U.S. Pat. Nos. 2,800,457 and 2,800,458; the interfacial polymerization as disclosed in Japanese Patent Publications No. 38-19574, No. 42-446 and No. 42-771; the in-situ method utilizing polymerization of monomers, as disclosed in Japanese Patent Publication No. 36-9168 and Japanese Patent Application Laid-open No. 51-9079; and the melt dispersion cooling as disclosed in British Patents No. 952,807 and No. 965,074.

As materials for forming the shell, either inorganic materials or organic materials are available so long as shells can be formed by the above methods for preparing capsules. Organic materials are preferred. Materials that can well transmit light are more preferred.

They are specifically exemplified by gelatin, gum arabic, starch, sodium alginate, polyvinyl alcohol, polyethylene, polyamide, polyester, polyurethane, polyurea, polystyrene, nitrocellulose, ethyl cellulose, methyl cellulose, a melamine-formaldehyde resin, an urea-formaldehyde resin, and blends or copolymers of any of these.

As is clear from what has been described above, the photocurable compositions of the present invention bring about a remarkable improvement in sensitivity because of the employment of any one or both of 2,6-diisopropyl-N,N-dimethylaniline and 2,4,6,N,N-pentamethylaniline as a photosensitizer. The photocurable compositions of the present invention can also be cured at a wavelength different from an absorption wavelength of the photopolymerization initiator because of the addition of the dye serving as a spectral sensitizer for controlling a curing wavelength. The photocurable compositions of the present invention still also enable employment of iron arene compounds, which are readily available as a photopolymerization initiator.

The photosensitive capsule of the present invention is formed as a capsule using as a core material the photocurable composition of the present invention having high sensitivity, where the core material is covered with the organic or inorganic material by a known technique. Hence, the photosensitive capsule exhibits a high sensitivity and also can be handled with ease, promising a wide use. The photosensitive capsule of the present invention can also be cured at a wavelength different from an absorption wavelength of the photopolymerization initiator because of the addition of the dye serving as a spectral sensitizer for controlling a curing wavelength. The photosensitive capsule of the present invention still also enables employment of iron arene compounds, which are readily available as photopolymerization initiators.

EXAMPLES

The present invention will be described below in greater detail by giving Examples. The present invention is by no means limited to the following Examples, and can be worked under appropriate modification of the materials used, the amount thereof and the production conditions within the scope of what has been described above.

In the following, Examples 1 to 3 are concerned with the photocurable composition, and Example 4, the photosensitive capsules.

Example 1

To 10 parts by weight of a 3:1 mixture of dipentaerythritol hexaacrylate and phenol acrylate, 2 parts by weight of a photopolymerization initiator ($\eta^5$-2,4-cyclopentadien-1-yl)[(1,2,3,4,5,6-$\eta$)-(1-methylethyl)benzene]iron(1+) hexafluorophosphate(1-) was added, followed by heating at 100° C. for 10 minutes. After cooling, 0.1 part by weight each of various amine type photosensitizers as shown in Table 1 were added to obtain photocurable compositions. (Photo) sensitivity of each photocurable composition obtained was measured.

The sensitivity was measured at a wavelength of 450 nm where the photopolymerization initiator has an absorption. To measure the photosensitivity, the photocurable composition was coated on a transparent polyethylene terephthalate (PET) film in a thickness of about 10 μm, and the same PET film as the above was further covered thereon for the purpose of providing an oxygen barrier. The product obtained was set in a spectroscopic sensitometer (manufactured by Narumi Shokai) to measure the sensitivity of each photocurable composition. The value obtained by measurement indicates a minimum energy at which the photocurable composition cures. Thus, the smaller its numerical value is, the higher the photosensitivity is. Results of the measurement are shown together in Table 1.

TABLE 1

Results of Sensitivity Measurement on
Photocurable Compositions

| Amine type sensitizer used | sensitivity (erg · cm$^{-2}$) |
|---|---|
| No sensitizer | 190,000 |
| Aniline | do. |
| N-methylaniline | 180,000 |
| N-ethylaniline | do. |
| N,N-dimethylaniline | 110,000 |
| N,N-diethylaniline | 98,000 |
| N,N-dimethyl-o-toluidine | 56,000 |
| N,N-dimethyl-m-toluidine | 52,000 |
| N,N-dimethyl-p-toluidine | 59,000 |
| 2,4,6,N,N-pentamethylaniline | 14,000 |
| 2,6-diisopropyl-N,N-dimethylaniline | 15,000 |
| Diethylamine | 200,000 |
| N,N-dimethylformamide | 180,000 |
| N,N-dimethylacetamide | do. |
| N,N-dimethylacrylamide | do. |
| N,N-dimethylacetamide dimethylacetal | do. |

As is seen from Table 1, the photocurable compositions show an especially high sensitivity when 2,6-diisopropyl-N,N-dimethylaniline or 2,4,6,N,N-pentamethylaniline is used.

Example 2

A yellow image recording photocurable composition containing a yellow pigment and having a photosensitivity at around 450 nm was produced.

In 100 parts by weight of a 3:1 mixture of dipentaerythritol hexaacrylate and phenol acrylate, 3 parts by weight of an azobarium lake pigment was dispersed using high-molecular weight polyurethane as a dispersant. To the dispersion obtained, 0.2 part by weight of a coumarin dye, 2 parts by weight of a photopolymerization initiator ($\eta^5$-2,4-cyclopentadien-1-yl) [(1,2,3,4,5,6-$\mu$)-(1-methylethyl)benzene]iron(1+) hexafluorophosphate(1−) was added, followed by heating at 100° C. for 10 minutes. After cooling, 1 part by weight of 2,6-diisopropyl-N,N-dimethylaniline or 2,4,6,N,N-pentamethylaniline was added to obtain a yellow image recording photocurable composition. For comparison, yellow image recording photocurable compositions were also obtained using other photosensitizers as shown in Table 2.

Sensitivity of each photocurable composition obtained was measured in the same manner as in Example 1. The sensitivity measured was sensitivity at a wavelength of 450 nm.

Results obtained are also shown in Table 2 together with the results about instances where other comparative photosensitizers are used.

As is seen from Table 2, the yellow image recording photocurable compositions show an especially high sensitivity when 2,6-diisopropyl-N,N-dimethylaniline or 2,4,6,N,N-pentamethylaniline is used.

Example 3

A magenta image recording photocurable composition containing a magenta pigment and having a photosensitivity at around 550 nm was produced.

In 100 parts by weight of a 3:1 mixture of dipentaerythritol hexaacrylate and phenol acrylate, 5 parts by weight of a quinacridone pigment was dispersed using high-molecular weight polyurethane as a dispersant. To the dispersion obtained, 0.3 part by weight of a cyanine dye, 2 parts by weight of a photopolymerization initiator ($\eta^5$-2,4-cyclopentadien-1-yl) [(1,2,3,4,5,6-$\eta$)-(1-methylethyl)benzene]iron(1+) hexafluorophosphate(1−) was added, followed by heating at 100° C. for 10 minutes. After cooling, 1 part by weight of 2,6-diisopropyl-N,N-dimethylaniline or 2,4,6,N,N-pentamethylaniline was added to obtain a magenta image recording photocurable composition. For comparison, magenta image recording photocurable compositions were also obtained using other photosensitizers as shown in Table 2.

Sensitivity of each photocurable composition obtained was measured in the same manner as in Example 1. The sensitivity measured was sensitivity at a wavelength of 550 nm.

Results obtained are shown in Table 2 together with the results about instances where other comparative photosensitizers are used.

As is seen from Table 2, the magenta image recording photocurable compositions show an especially high sensitivity when 2,6-diisopropyl-N,N-dimethylaniline or 2,4,6,N,N-pentamethylaniline is used.

TABLE 2

Results of Spectral Sensitivity Measurement on
Photocurable Compositions

| | Sensitivity | |
|---|---|---|
| | Yellow | Magenta |
| Amine type sensitizer used | (erg · cm$^{-2}$) | |
| No sensitizer | 9,600 | 11,000 |
| Aniline | 9,400 | 14,000 |
| N-methylaniline | 10,000 | 15,000 |
| N-ethylaniline | 9,600 | 15,000 |
| N,N-dimethylaniline | 4,000 | 5,000 |
| N,N-diethylaniline | 7,700 | 12,000 |
| N,N-dimethyl-o-toluidine | 5,500 | 7,300 |
| N,N-dimethyl-m-toluidine | 4,300 | 5,500 |
| N,N-dimethyl-p-toluidine | 4,600 | 4,700 |
| 2,4,6,N,N-pentamethylaniline | 1,300 | 880 |
| 2,6-diisopropyl-N,N-dimethylaniline | 1,600 | 1,200 |
| Diethylamine | 34,000 | 20,000 |
| N,N-dimethylformamide | 7,300 | 8,900 |
| N,N-dimethylacetamide | 8,400 | 11,000 |
| N,N-dimethylacrylamide | 8,600 | 11,000 |
| N,N-dimethylacetamide dimethylacetal | 30,000 | 21,000 |

Example 4

In 100 ml of a 1:1 mixed aqueous solution of an aqueous partially sodium chloride solution of 5% of an emulsifying agent polystyrene sulfonic acid and an aqueous solution of 5% of a styrene/maleic anhydride copolymer, 100 g of any photocurable composition of the present invention was added, followed by stirring at 6,000 rpm by means of a homogenizer for 5 minutes to obtain what is called an O/W emulsion in which liquid components are present in the aqueous solution in the form of droplets with a size of 5 to 20 µm.

Separately, a commercially available melamine powder was added in an aqueous 37% formaldehyde, and the pH of the mixture obtained was adjusted to 9.0 using a sodium hydroxide solution, followed by heating at a water temperature of 60° C. for 30 minutes to obtain a melamine-formaldehyde prepolymer.

To the O/W emulsion previously prepared, the melamine-formaldehyde prepolymer was added. While stirring the mixture at 100 to 300 rpm by means of a homogenizer, the mixture was heated so as to have a water temperature of 80° C., and was kept in this state for 5 hours. Thereafter, the pH of the resulting mixture was adjusted to 7, followed by cooling to room temperature. As the result, shell materials formed of a melamine-formaldehyde resin were deposited around the O/W emulsion droplets. Thus, a microcapsular emulsion was obtained.

What is claimed is:

1. A photocurable composition highly sensitive to near infrared radiation and light of a wavelength of 550 nm or less, comprising an unsaturated group-containing compound as a base material, a metal arene compound as a photopolymerization initiator and an aniline compound as a photosensitizer, wherein;

said aniline compound is at least one of 2,6-diisopropyl-N,N-dimethylaniline and 2,4,6,N,N-pentamethylaniline.

2. The photocurable composition according to claim 1, wherein said unsaturated group-containing compound comprises an ethylene unsaturated group-containing compound.

3. The photocurable composition according to claim 2, wherein said ethylene unsaturated group-containing compound is at least one selected from the group consisting of acrylic acid and a salt thereof, acrylic ester, acrylamide, methacrylic acid and a salt thereof, methacrylic ester, methacrylamide, maleic anhydride, maleate, itaconate, styrene, vinyl ether, vinyl ester, a N-vinyl heterocyclic compound, allyl ether, allyl ester, and derivatives of these.

4. The photocurable composition according to claim 3, wherein said ethylene unsaturated group-containing compound is acrylic ester or methacrylic ester.

5. The photocurable composition according to claim 4, wherein said acrylic ester is at least one selected from the group consisting of butyl acrylate, cyclohexyl acrylate, ethylhexyl acrylate, benzyl acrylate, furfuryl acrylate, ethoxyethyl acrylate, nonylphenyloxyethyl acrylate, hexanediol acrylate, 1,3-dioxolane acrylate, hexanediol diacrylate, butanediol diacrylate, neopentyl glycol diacrylate, polyethylene glycol diacrylate, tricyclodecane dimethyrol diacrylate, tripropylene glycol diacrylate, bisphenol-A diacrylate, pentaerythritol triacrylate, dipentaerythritol hexaacrylate, hexaacrylate of caprolactone adduct of dipentaerythritol, trimethyrolpropane triacrylate, triacrylate of a propylene oxide adduct of trimethyrolpropane, diacrylate of polyoxyethylated bisphenol-A, polyester acrylate, and polyurethane acrylate.

6. The photocurable composition according to claim 4, wherein said methacrylic ester is at least one selected from the group consisting of butyl methacrylate, cyclohexyl methacrylate, ethylhexyl methacrylate, benzyl methacrylate, furfuryl methacrylate, ethoxyethyl methacrylate, nonylphenyloxyethyl methacrylate, hexanediol methacrylate, 1,3-dioxolane methacrylate, hexanediol dimethacrylate, butanediol dimethacrylate, neopentyl glycol dimethacrylate, polyethylene glycol dimethacrylate, tricyclodecane dimethyrol dimethacrylate, tripropylene glycol dimethacrylate, bisphenol-A dimethacrylate, pentaerythritol trimethacrylate, dipentaerythritol hexamethacrylate, hexamethacrylate of a caprolactone adduct of dipentaerythritol, trimethyrolpropane trimethacrylate, trimethacrylate of a propylene oxide adduct of trimethyrolpropane, dimethacrylate of polyoxyethylated bisphenol-A, polyester methacrylate, and polyurethane methacrylate.

7. The photocurable composition according to claim 1, wherein said metal arene compound is an arene complex of iron, nickel, cobalt or chromium.

8. The photocurable composition according to claim 7, wherein said metal arene compound is an iron arene complex.

9. The photocurable composition according to claim 8, wherein said iron arene complex is ($\eta^5$-2,4-cyclopentadien-1-yl)[(1,2,3,4,5,6-$\eta$)-(1-methylethyl)benzene]iron(1+) hexafluorophosphate(1−).

10. The photocurable composition according to claim 1, wherein the metal arene compound as a photopolymerization initiator is contained in an amount of from 0.1 to 20 parts by weight, and the aniline compound as a photosensitizer is contained in an amount of from 0.1 to 10 parts by weight, based on 100 parts by weight of the unsaturated group-containing compound.

11. The photocurable composition according to claim 1, wherein the metal arene compound as a photopolymerization initiator is contained in an amount of from 1 to 10 parts by weight, and the aniline compound as a photosensitizer is contained in an amount of from 0.5 to 2 parts by weight, based on 100 parts by weight of the unsaturated group-containing compound.

12. The photocurable composition according to claim 1, further comprising a dye as a spectral sensitizer for controlling a curing wavelength of the unsaturated group-containing compound.

13. The photocurable composition according to claim 12, wherein said dye is at least one selected from the group consisting of a xanthene dye, a coumarin dye, a merocyanine dye, a thiazine dye, an azine dye, a methine dye, an oxazine dye, a phenylmethane dye, a cyanine dye, an azo dye, an anthraquinone dye, a pyrazoline dye, a stilbene dye, a quinoline dyes and a leuco dye.

14. The photocurable composition according to claim 12, wherein said dye is contained in an amount of from 0.01 to 1 parts by weight based on 100 parts by weight of the unsaturated group-containing compound.

15. The photocurable composition according to claim 14, wherein said dye is contained in an amount of from 0.05 to 0.2 parts by weight based on 100 parts by weight of the unsaturated group-containing compound.

16. A photocurable composition, comprising an unsaturated group-containing compound as a base material, a metal arene compound as a photopolymerization initiator, an aniline compound as a photosensitizer and a dye as a spectral sensitizer for controlling a curing wavelength of the unsaturated group-containing compound, wherein;

said aniline compound is at least one of 2,6-diisopropyl-N,N-dimethylaniline and 2,4,6,N,N-pentamethylaniline, and said dye is at least one of a coumarin dye and a cyanine dye.

17. The photocurable composition according to claim 16, wherein said unsaturated group-containing compound comprises an ethylene unsaturated group-containing compound.

18. The photocurable composition according to claim 17, wherein said ethylene unsaturated group-containing compound is at least one selected from the group consisting of acrylic acid and a salt thereof, acrylic ester, acrylamide, methacrylic acid and a salt thereof, methacrylic ester, methacrylamide, maleic anhydride, maleate, itaconate, styrene, vinyl ether, vinyl ester, a N-vinyl heterocyclic compound, allyl ether, allyl ester, and derivatives of these.

19. The photocurable composition according to claim 18, wherein said ethylene unsaturated group-containing compound is acrylic ester or methacrylic ester.

20. The photocurable composition according to claim 19, wherein said acrylic ester is at least one selected from the group consisting of butyl acrylate, cyclohexyl acrylate, ethylhexyl acrylate, benzyl acrylate, furfuryl acrylate, ethoxyethyl acrylate, nonylphenyloxyethyl acrylate, hexanediol acrylate, 1,3-dioxolane acrylate, hexanediol diacrylate, butanediol diacrylate, neopentyl glycol diacrylate, polyethylene glycol diacrylate, tricyclodecane dimethyrol diacrylate, tripropylene glycol diacrylate, bisphenol-A diacrylate, pentaerythritol triacrylate, dipentaerythritol hexaacrylate, hexaacrylate of caprolactone adduct of dipentaerythritol, trimethyrolpropane triacrylate, triacrylate of a propylene oxide adduct of trimethyrolpropane, diacrylate of polyoxyethylated bisphenol-A, polyester acrylate, and polyurethane acrylate.

21. The photocurable composition according to claim 19, wherein said methacrylic ester is at least one selected from the group consisting of butyl methacrylate, cyclohexyl methacrylate, ethylhexyl methacrylate, benzyl methacrylate, furfuryl methacrylate, ethoxyethyl methacrylate, nonylphenyloxyethyl methacrylate, hexanediol methacrylate, 1,3-dioxolane methacrylate, hexanediol dimethacrylate, butanediol dimethacrylate, neopentyl glycol dimethacrylate, polyethylene glycol dimethacrylate, tricyclodecane dimethyrol dimethacrylate, tripropylene glycol dimethacrylate, bisphenol-A dimethacrylate, pentaerythritol trimethacrylate, dipentaerythritol hexamethacrylate, hexamethacrylate of a caprolactone adduct of dipentaerythritol, trimethyrolpropane trimethacrylate, trimethacrylate of a propylene oxide adduct of trimethyrolpropane, dimethacrylate of polyoxyethylated bisphenol-A, polyester methacrylate, and polyurethane methacrylate.

22. The photocurable composition according to claim 16, wherein said metal arene compound is an arene complex of iron, nickel, cobalt or chromium.

23. The photocurable composition according to claim 22, wherein said metal arene compound is an iron arene complex.

24. The photocurable composition according to claim 23, wherein said iron arene complex is ($\eta^5$-2,4-cyclopentadien-1-yl)[(1,2,3,4,5,6-$\eta$)-(1-methylethyl)benzene]iron(1+) hexafluorophosphate(1−).

25. The photocurable composition according to claim 24, wherein the metal arene compound as a photopolymerization initiator is contained in an amount of from 1 to 10 parts by weight, the aniline compound as a photosensitizer is contained in an amount of from 0.5 to 2 parts by weight, and said dye is contained in an amount of from 0.05 to 0.2 parts by weight, based on 100 parts by weight of the unsaturated group-containing compound.

26. The photocurable composition according to claim 16, wherein the metal arene compound as a photopolymerization initiator is contained in an amount of from 0.1 to 20 parts by weight, the aniline compound as a photosensitizer is contained in an amount of from 0.1 to 10 parts by weight, and said dye is contained in an amount of from 0.01 to 1 parts by weight, based on 100 parts by weight of the unsaturated group-containing compound.

27. The photocurable composition according to claim 16, further comprising another dye other than the coumarin dye and the cyanine dye as a spectral sensitizer, said another dye being at least one selected from the group consisting of a xanthene dye, a merocyanine dye, a thiazine dye, an azine dye, a methine dye, an oxazine dye, a phenylmethane dye, an azo dye, an anthraquinone dye, a pyrazoline dye, a stilbene dye, a quinoline dyes and a leuco dye.

28. The photocurable composition according to claim 16, wherein said coumarin dye has high sensitivity to light of a wavelength around 450 nm and said cyanine dye has high sensitivity to light of a wavelength around 550 nm.

29. A photosensitive capsule internally holding a photocurable composition highly sensitive to near infrared radiation and light of a wavelength of 550 nm or less, said composition comprising an unsaturated group-containing compound as a base material, a metal arene compound as a photopolymerization initiator and an aniline compound as a photosensitizer, wherein;

the aniline compound is at least one of 2,6-diisopropyl-N,N-dimethylaniline and 2,4,6,N,N-pentamethylaniline.

30. The photosensitive capsule according to claim 29, wherein said unsaturated group-containing compound comprises acrylic ester or methacrylic ester.

31. The photosensitive capsule according to claim 29, wherein said metal arene compound is ($\eta^5$-2,4-cyclopentadien-1-yl)[(1,2,3,4,5,6-$\eta$)-(1-methylethyl)benzene]iron(1+) hexafluorophosphate (1−).

32. The photosensitive capsule according to claim 29, further comprising at least one of a coumarin dye and a cyanine dye as a spectral sensitizer for controlling a curing wavelength of the unsaturated group-containing compound.

33. The photosensitive capsule according to claim 32, wherein the metal arene compound as a photopolymerization initiator is contained in an amount of from 0.1 to 20 parts by weight, the aniline compound as a photosensitizer is contained in an amount of from 0.1 to 10 parts by weight, and said dye is contained in an amount of from 0.01 to 1 parts by weight, based on 100 parts by weight of the unsaturated group-containing compound.

34. The photosensitive capsule according to claim 33, wherein the metal arene compound as a photopolymerization initiator is contained in an amount of from 1 to 10 parts by weight, the aniline compound as a photosensitizer is contained in an amount of from 0.5 to 2 parts by weight, and said dye is contained in an amount of from 0.05 to 0.2 parts by weight, based on 100 parts by weight of the unsaturated group-containing compound.

35. The photosensitive capsule according to claim 32, further conmprising another dye other than the coumarin dye and the cyanine dye as a spectral sensitizer, said another dye being at least one selected from the group consisting of a xanthene dye, a merocyanine dye, a thiazine dye, an azine dye, a methine dye, an oxazine dye, a phenylmethane dye, an azo dye, an anthraquinone dye, a pyrazoline dye, a stilbene dye, a quinoline dyes and a leuco dye.

36. The photosensitive capsule according to claim 32, wherein said coumarin dye has high sensitivity to light of a wavelength around 450 nm and said cyanine dye has high sensitivity to light of a wavelength around 550 nm.

37. The photosensitive capsule according to claim 29, having an average particle diameter of from 5 to 20 μm.

38. The photosensitive capsule according to claim 29, wherein said photocurable composition is held in a shell.

39. The photosensitive capsule according to claim 38, wherein said shell is constituted of a light-transmitting organic material.

40. The photosensitive capsule according to claim 39, wherein said organic material is at least one selected from the group consisting of gelatin, gum arabic, starch, sodium alginate, polyvinyl alcohol, polyethylene, polyamide, polyester, polyurethane, polyurea, polystyrene, nitrocellulose, ethyl cellulose, methyl cellulose, a melamine-formaldehyde resin, an urea-formaldehyde resin, and blends or copolymers of these.

* * * * *